United States Patent
Zhang

(10) Patent No.: US 12,007,703 B2
(45) Date of Patent: Jun. 11, 2024

(54) MARK DETECTION METHOD AND APPARATUS, AND COMPUTER-READABLE STORAGE MEDIUM

(71) Applicant: CHANGXIN MEMORY TECHNOLOGIES, INC., Anhui (CN)

(72) Inventor: Yan Zhang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 448 days.

(21) Appl. No.: 17/310,644

(22) PCT Filed: Mar. 25, 2021

(86) PCT No.: PCT/CN2021/083068
§ 371 (c)(1),
(2) Date: Aug. 13, 2021

(87) PCT Pub. No.: WO2021/197206
PCT Pub. Date: Oct. 7, 2021

(65) Prior Publication Data
US 2022/0317583 A1  Oct. 6, 2022

(30) Foreign Application Priority Data
Mar. 31, 2020  (CN) .......................... 202010243322.4

(51) Int. Cl.
*G03F 9/00* (2006.01)
*H01L 23/544* (2006.01)
(52) U.S. Cl.
CPC .......... *G03F 9/7088* (2013.01); *G03F 9/7076* (2013.01); *H01L 23/544* (2013.01)

(58) Field of Classification Search
CPC ........ G03F 9/7088; G03F 9/7076; G03F 1/42; G03F 1/84; H01L 23/544; H01L 21/00;
(Continued)

(56) References Cited

U.S. PATENT DOCUMENTS

| 5,350,704 A | 9/1994 | Anderson et al. |
| 2004/0137649 A1 | 7/2004 | Kishida et al. |

(Continued)

FOREIGN PATENT DOCUMENTS

| CN | 104062531 A | 9/2014 |
| CN | 104993582 A | 10/2015 |

(Continued)

OTHER PUBLICATIONS

International Search Report in Application No. PCT/CN2021/083068, mailed on Jun. 23, 2021.
(Continued)

*Primary Examiner* — Stacy Whitmore
(74) *Attorney, Agent, or Firm* — Syncoda LLC; Feng Ma

(57) ABSTRACT

A mark detection method includes: acquiring on-off information of marks on a photomask to be manufactured; comparing the on-off information with preset on-off information to determine whether the on-off information is consistent with the preset on-off information; and, correcting the on-off information according to the preset on-off information when it is determined that the on-off information is inconsistent with the preset on-off information. The mark detection method and apparatus and the computer-readable storage medium according to the present disclosure can automatically detect whether the on-off of marks is accurate, thereby improving the detection accuracy and reducing labor cost.

19 Claims, 4 Drawing Sheets

(58) Field of Classification Search
CPC ..................... G06T 7/00; G06T 7/0004; G06T 2207/30148
See application file for complete search history.

(56) References Cited

U.S. PATENT DOCUMENTS

2004/0207856 A1    10/2004    Sato et al.
2010/0211352 A1    8/2010    Morinaga et al.

FOREIGN PATENT DOCUMENTS

| CN | 108920436 A | | 11/2018 |
|----|-------------|---|---------|
| CN | 109543308 A | | 3/2019 |
| JP | 2007236100 A | | 9/2007 |
| JP | 2012242575 A | * | 12/2012 |
| JP | 2012242575 A | | 12/2012 |

OTHER PUBLICATIONS

China first office action in Application No. 202010243322.4, mailed on Dec. 14, 2022.

\* cited by examiner

MARK DETECTION METHOD AND APPARATUS, AND COMPUTER-READABLE STORAGE MEDIUM

CROSS-REFERENCE TO RELATED APPLICATIONS

This application is a national stage of International Application No. PCT/CN2021/083068 filed on Mar. 25, 2021, which claims priority to Chinese Patent Application No. 202010243322.4 filed on Mar. 31, 2020. The disclosures of these applications are hereby incorporated by reference in their entirety.

TECHNICAL FIELD

Embodiments of the present disclosure relate to the technical field of semiconductor manufacturing, in particular to a mark detection method and apparatus, and a computer-readable storage medium.

BACKGROUND

In the manufacturing process of integrated circuits, it is necessary to correctly set on-off information of marks on a photomask to be manufactured. In the prior art, during preparing a manufacturing file for the photomask to be manufactured, it is determined by a manual detection method whether the on-off information of marks on the photomask to be manufactured is set correctly. It was found that there are at least the following problems in the prior art: the manual detection method is difficult to ensure the correctness of the on-off status of marks and will consume a high labor cost.

SUMMARY

The purpose of some embodiments of the present disclosure is to provide a mark detection method and apparatus and a computer-readable storage medium, which can automatically detect whether the on-off of marks is accurate, thereby improving the detection accuracy and reducing labor cost.

In order to solve the technical problem mentioned above, some embodiments of the present disclosure provide a mark detection method, comprising:

acquiring on-off information of marks on a photomask to be manufactured; comparing the on-off information with preset on-off information to determine whether the on-off information is consistent with the preset on-off information; and correcting the on-off information according to the preset on-off information when it is determined that the on-off information is inconsistent with the preset on-off information.

Some embodiments of the present disclosure further provide a mark detection apparatus, comprising: at least one processor; and, a memory in communicative connection to the at least one processor, wherein the memory stores instructions performable by the at least one processor, the instructions are performed by the at least one processor, the at least one processor to perform the mark detection method described above.

Some embodiments of the present disclosure further provide a computer-readable storage medium storing computer programs, when the computer programs are performed by a processor, the mark detection method described above is realized.

Compared with the prior art, in some embodiments of the present disclosure, by acquiring on-off information of marks on a photomask to be manufactured, the on-off status of the marks on the photomask to be manufactured can be known, so it is convenient for checking in subsequent steps. Since the on-off information of the marks will be preset before the preparation of the photomask to be manufactured in order to prepare marks satisfying different requirements, by comparing the on-off information with the preset on-off information to determine whether the on-off information is consistent with the preset on-off information, it can be automatically detected by scripts whether the on-off of the marks on the photomask to be manufactured is accurate, thereby improving the detection accuracy, reducing the labor cost, and avoiding the situation that the manual detection method is difficult to ensure the correctness of the on-off status of marks and will consume a high labor cost. When it is determined that the on-off information is inconsistent with the preset on-off information, the on-off information is corrected according to the preset on-off information, so that errors are automatically corrected when the on-off information of the marks is wrong.

In addition, the acquiring on-off information of marks on a photomask to be manufactured comprises: acquiring on-off information of N marks on a photomask to be manufactured, the N marks containing M mark types, both N and M being integers greater than 1.

In addition, the M mark types comprise one or any combination of the following types: overlay mark, alignment mark and detection mark.

In addition, before the comparing the on-off information with preset on-off information, the method further comprises: establishing M blocks according to the M mark types, one of the blocks containing a plurality of marks belonging to a same mark type; and merging the M blocks, and setting M identification layers according to the M blocks, one block corresponding to one identification layer; and, the comparing the on-off information with preset on-off information comprises: comparing the on-off information of the marks in the merged blocks with preset on-off information according to the identification layers.

In addition, the establishing M blocks according to the M mark types comprises: determining, according to the mark types, distribution regions of the marks on the photomask to be manufactured; and, generating the blocks according to the distribution regions.

In addition, the distribution regions comprise a plurality of mark strip-shaped regions.

In addition, the number of marks and mark type of marks contained in different mark strip-shaped regions in a same block are the same.

In addition, the preset on-off information is acquired in the following way: acquiring sub preset on-off information of each mark; and, integrating the sub preset on-off information to generate the preset on-off information.

In addition, the sub preset on-off information is integrated by scripts, and the on-off information of the marks in the merged blocks is compared with the preset on-off information by scripts.

In addition, the comparing the on-off information with preset on-off information comprises: inputting the on-off information and the preset on-off information into a preset detection program; and, comparing the on-off information with the preset on-off information according to the detection program.

In addition, after correcting the on-off information according to the preset on-off information, the method further comprises: determining whether the on-off information is consistent with the preset on-off information again; and, when it is determined that the on-off information is inconsistent with the preset on-off information, correcting the on-off information according to the preset on-off information until the on-off information is consistent with the preset on-off information.

BRIEF DESCRIPTION OF THE DRAWINGS

One or more embodiments will be exemplified descriptions by pictures in the corresponding drawings. These exemplified descriptions do not constitute any limitation to the embodiments. Elements with the same reference numerals in the drawings are represented as similar elements. Unless otherwise stated, the drawings are not necessarily drawn to scale.

DETAILED DESCRIPTION

To make the objectives, technical solutions and advantages of the embodiments of the present disclosure clearer, the embodiments of the present disclosure will be further described below in detail with reference to the drawings. However, it should be understood by a person of ordinary skill in the art that, in the embodiments of the present disclosure, many technical details are provided for the better understanding of the present disclosure. However, the technical solutions sought to be protected by the present disclosure can be implemented, even without these technical details and various changes and modifications based on the following embodiments.

Figure 1:
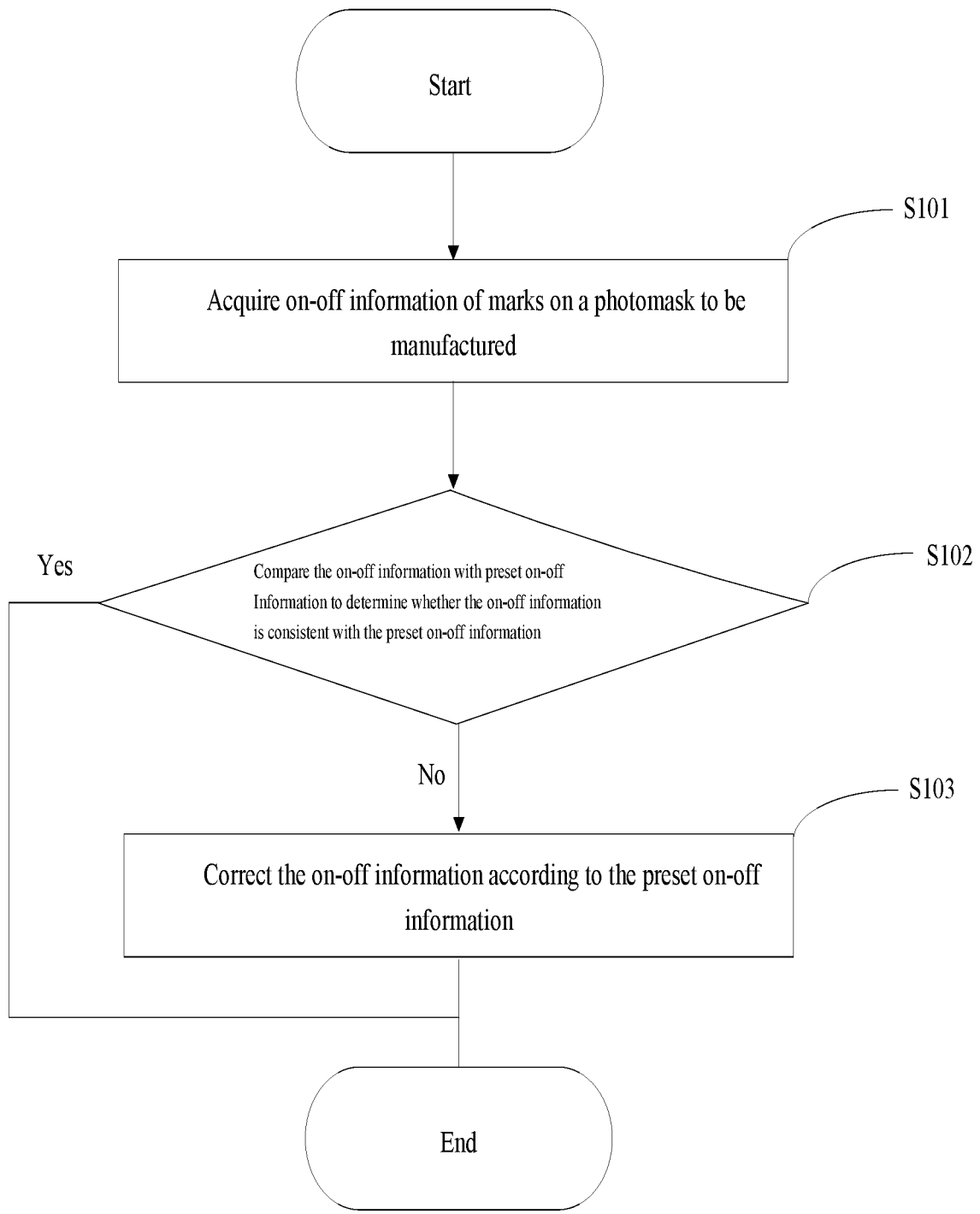
FIG. 1 is a flowchart of a mark detection method according to an embodiment of the present disclosure.

An embodiment of the present disclosure relates to a mark detection method. The specific process is shown in FIG. 1, comprising:

S101: On-off information of marks on a photomask to be manufactured is acquired.

Specifically, by setting the on-off of a plurality of marks on the photomask to be manufactured, marks satisfying different requirements can be prepared. That is, if there are N marks on the photomask to be manufactured (where N is an integer greater than 1), so N pieces of on-off information are acquired. It should be understood that the size of N is not specifically limited in this embodiment. In an example, the on-off information may be interpreted as that the marks on the photomask to be manufactured are transparent, opaque or partially transparent.

More specifically, the N marks contain M mark types, where M is an integer greater than 1. The M mark types comprise one or any combination of the following types: overlay mark, alignment mark and detection mark. The size of M is not specifically limited in this embodiment. In an example, the overlay mark may be interpreted as a pattern on a back photomask to be manufactured at the same position as an overlay pattern on a front photomask to be manufactured; the alignment mark may be interpreted as a pattern on a back photomask to be manufactured at the same position as an alignment pattern on a front photomask to be manufactured; and, the detection mark may be interpreted as a pattern on a back photomask to be manufactured at the same position as a detection pattern on a front photomask to be manufactured. Specifically, the overlay pattern comprise an overlay front pattern in OVL measurement, for example, an overlay front pattern in an AIM pattern, a Strip-shaped-in-Strip-shaped pattern or a Box-in-Box pattern; the alignment pattern comprises a front pattern that needs to be aligned during exposure of a photoetching machine; and, the detection pattern comprises a front pattern for detecting the process quality, for example, a pattern for detecting film thickness, a pattern for detecting electrical properties, or the like.

S102: The on-off information is compared with preset on-off information to determine whether the on-off information is consistent with the preset on-off information; the process ends when it is determined that the on-off information is consistent with the preset on-off information; and, a step S103 will be performed when it is determined that the on-off information is inconsistent with the preset on-off information.

Specifically, the comparing the on-off information with preset on-off information comprises: inputting the on-off information and the preset on-off information into a preset detection program; and, comparing the on-off information with the preset on-off information according to the detection program. It should be understood that the detection program in this embodiment processes the marks by using scripts, so as to realize on-off detection of each mark.

More specifically, in this embodiment, the preset on-off information may be acquired in the following way: acquiring sub preset on-off information of each mark; and, integrating the sub preset on-off information to generate the preset on-off information. As an example, first, the on-off information of marks on a same photomask to be manufactured is sorted out, the on-off information of all marks on a plurality of photomasks to be manufactured is then integrated to obtain complete preset on-off information (which may be sorted into a table form), so that the preset on-off information is convenient used for editing scripts (i.e., detection programs).

S103: The on-off information is corrected according to the preset on-off information.

Specifically, when the on-off information is inconsistent with the preset on-off information, the on-off information is adjusted to be consistent with the preset on-off information. For example, if mark A is preset to be turned off but is turned on actually, mark A should be adjusted to be turned off.

Compared with the prior art, in the embodiment of the present disclosure, by acquiring on-off information of marks on a photomask to be manufactured, the on-off status of the marks on the photomask to be manufactured can be known, so it is convenient for checking in subsequent steps. Since the on-off information of the marks will be preset before the preparation of the photomask to be manufactured in order to prepare marks satisfying different requirements. Therefore, by comparing the on-off information with the preset on-off information to determine whether the on-off information is consistent with the preset on-off information, it can be automatically detected by scripts whether the on-off of the marks on the photomask to be manufactured is accurate, thereby improving the detection accuracy, reducing the labor cost, and avoiding the situation that the manual detection method is difficult to ensure the correctness of the on-off status of marks and will consume a high labor cost. When it is determined that the on-off information is inconsistent with the preset on-off information, the on-off information is corrected according to the preset on-off information, so that errors are automatically corrected when the on-off information of the marks is wrong.

Another embodiment of the present disclosure relates to a mark detection method. This embodiment is a further improvement based on the foregoing embodiment, the specific improvement lies in: in this embodiment, before comparing the on-off information with preset on-off information, the method further comprises: establishing M blocks according to the M mark types, one of the blocks containing a plurality of marks belonging to a same mark type; and merging the M blocks, and setting M identification layers according to the M blocks, one block corresponding to one identification layer; and, the comparing the on-off information with preset on-off information comprises: comparing the on-off information of the marks in the merged blocks with preset on-off information according to the identification layers. In this way, the time for mark detection can be reduced, and the efficiency of mark detection can be thus improved.

Figure 2:
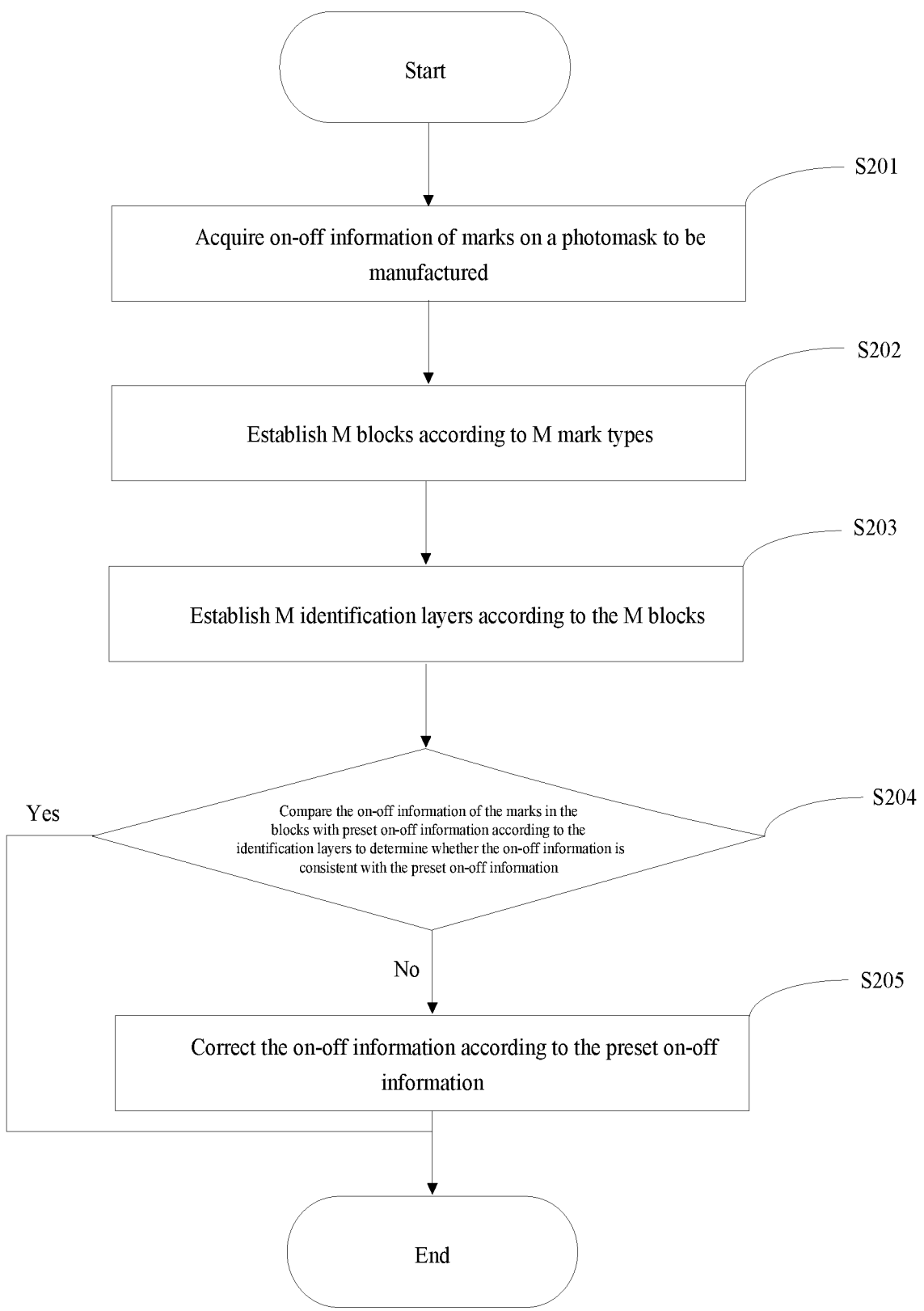
FIG. 2 is a flowchart of a mark detection method according to an embodiment of the present disclosure.

In this embodiment, the specific process is shown in FIG. 2, comprising:

S201: On-off information of marks on a photomask to be manufactured is acquired.

S202: M blocks are established according to M mark types.

Specifically, one of the blocks contains a plurality of marks belonging to a same mark type. In this embodiment, establishing M blocks according to M mark types may comprise: determining, according to the mark types, distribution regions of the marks on the photomask to be manufactured; and, generating the blocks according to the distribution regions.

S203: M identification layers are established according to the M blocks.

Specifically, one block corresponds to one identification layer, and a serial number will be defined for each identification layer. For example, serial numbers 111, 112 and 113 represent three different identification layers.

S204: The on-off information of the marks in the blocks is compared with preset on-off information according to the identification layers to determine whether the on-off information is consistent with the preset on-off information; the process ends when it is determined that the on-off information of the marks is consistent with the preset on-off information; and, a step S205 will be performed when it is determined that the on-off information of the marks is inconsistent with the preset on-off information.

Specifically, since the types of marks in each identification layer are the same, only the identification layer needs to be detected in the process of detecting the marks so that unnecessary mark detection is reduced and the efficiency of mark detection is improved.

S205: The on-off information is corrected according to the preset on-off information.

The steps S201 and S205 in this embodiment are similar to the steps S101 and S103 in the foregoing embodiment, and will not be repeated here to avoid repetition.

To facilitate the understanding, the mark detection method in this embodiment will be described below by specific examples.

1. The on-off information (which may be Scribe line layout JDS that may be regarded as a file) of marks on the photomask to be manufactured and the preset on-off information (a mark on-off table) are provided.

2. For a plurality of marks of each type on the photomask to be manufactured, a block is established to contain these marks, and the block is marked by an identification layer. Specifically, each block may contain all marks of the same type; the blocks are generated according to distribution regions of all marks of the same type on the photomask to be manufactured; the distribution regions may comprise a plurality of mark strip-shaped regions; the mark strip-shaped regions may be rectangular, and each of the mark strip-shaped regions comprises a plurality of marks of the same type; and, different mark strip-shaped regions on the same block are the same in size and contain the same number of marks. By such setting, it is possible to prevent erroneous comparison of the on-off information of marks of different types during comparison.

3. The blocks of the marks of different types are merged, and each block is marked by an identification layer, so that quick and accurate processing can be realized by using scripts.

4. The on-off information of the marks in the merged blocks is compared with the mark on-off table by using the identification layers.

Compared with the prior art, in the embodiments of the present disclosure, by acquiring on-off information of marks on a photomask to be manufactured, the on-off status of the marks on the photomask to be manufactured can be known, so it is convenient for checking in subsequent steps. Since the on-off information of the marks will be preset before the preparation of the photomask to be manufactured in order to prepare marks satisfying different requirements. Therefore, by comparing the on-off information with the preset on-off information to determine whether the on-off information is consistent with the preset on-off information, it can be automatically detected by scripts whether the on-off status of the marks on the photomask to be manufactured is accurate, thereby improving the detection accuracy, reducing the labor cost, and avoiding the situation that the manual detection method is difficult to ensure the correctness of the on-off status of marks and will consume a high labor cost. When it is determined that the on-off information is inconsistent with the preset on-off information, the on-off information is corrected according to the preset on-off information, so that errors are automatically corrected when the on-off information of the marks is wrong.

Another embodiment of the present disclosure relates to a mark detection method. This embodiment is a further improvement based on the foregoing embodiment, the specific improvement lies in: in this embodiment, after correcting the on-off information according to the preset on-off information, the method further comprises: determining whether the on-off information is consistent with the preset on-off information again; and, when it is determined that the on-off information is inconsistent with the preset on-off information, correcting the on-off information according to the preset on-off information until the on-off information is consistent with the preset on-off information. In this way, the accuracy of mark detection is further ensured.

Figure 3:
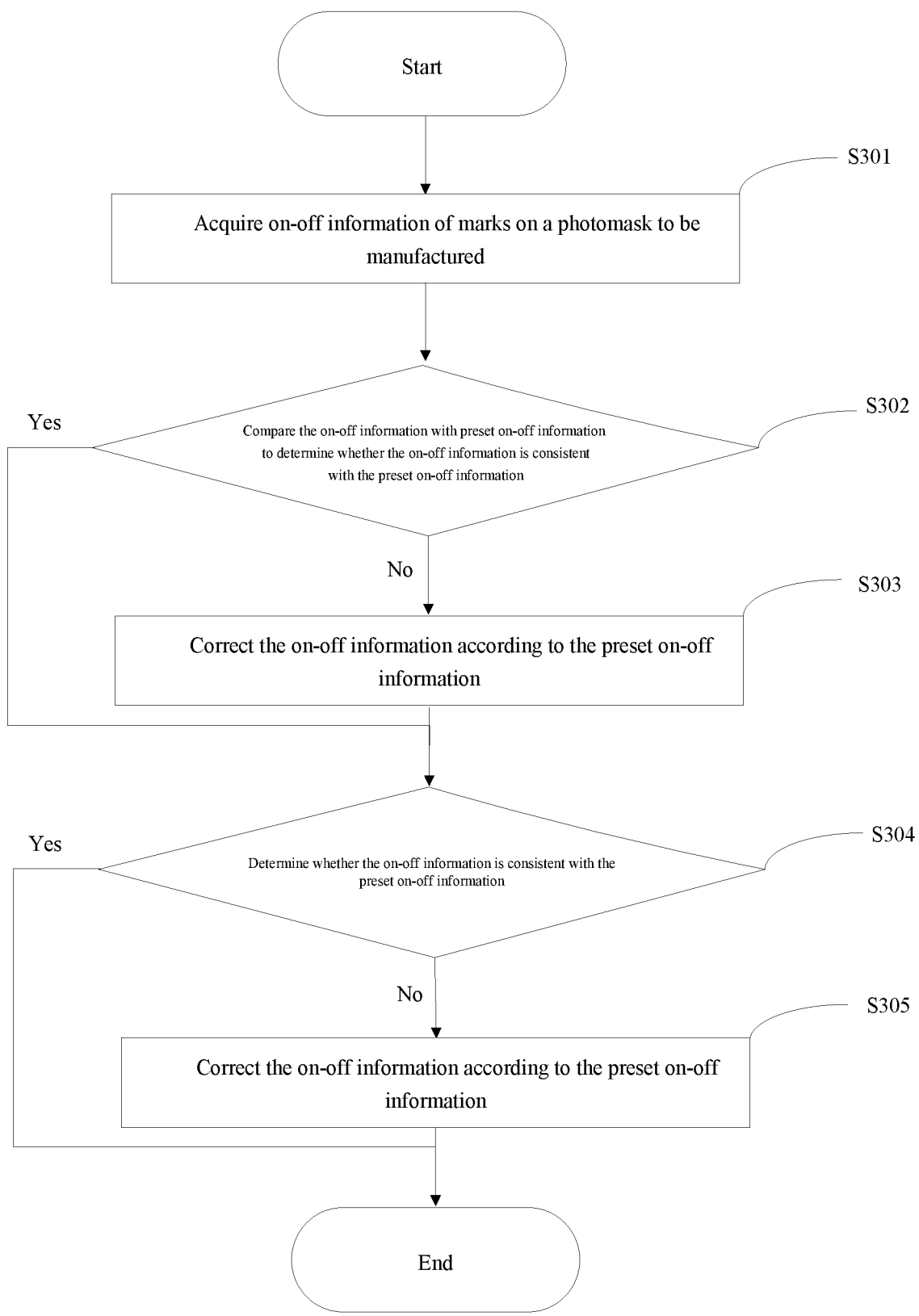
FIG. 3 is a flowchart of a mark detection method according to an embodiment of the present disclosure.

In this embodiment, the specific process is shown in FIG. 3, comprising following steps:

S301: On-off information of marks on a photomask to be manufactured is acquired.

S302: The on-off information is compared with preset on-off information to determine whether the on-off information is consistent with the preset on-off information; the process ends when it is determined that the on-off information is consistent with the preset on-off information; and, a step S303 will be performed when it is determined that the on-off information is inconsistent with the preset on-off information.

S303: The on-off information is corrected according to the preset on-off information.

The steps S301 to S303 in this embodiment are similar to the steps S101 to S103 in the foregoing embodiment, and will not be repeated here to avoid repetition.

S304: It is determined whether the on-off information is consistent with the preset on-off information again; the process ends when it is determined that the on-off information is consistent with the preset on-off information; and, a step S305 will be performed when it is determined that the on-off information is inconsistent with the preset on-off information.

S305: The on-off information is corrected according to the preset on-off information until the on-off information is consistent with the preset on-off information.

Compared with the prior art, in the embodiment of the present disclosure, by acquiring on-off information of marks on a photomask to be manufactured, the on-off status of the marks on the photomask to be manufactured can be known, so it is convenient for checking in subsequent steps. Since the on-off information of the marks will be preset before the preparation of the photomask to be manufactured in order to prepare marks satisfying different requirements. Therefore, by comparing the on-off information with the preset on-off information to determine whether the on-off information is consistent with the preset on-off information, it can be automatically detected by scripts whether the on-off status of the marks on the photomask to be manufactured is accurate, thereby improving the detection accuracy, reducing the labor cost, and avoiding the situation that the manual detection method is difficult to ensure the correctness of the on-off status of marks and will consume a high labor cost. When it is determined that the on-off information is inconsistent with the preset on-off information, the on-off information is corrected according to the preset on-off information, so that errors are automatically corrected when the on-off information of the marks is wrong.

Figure 4:
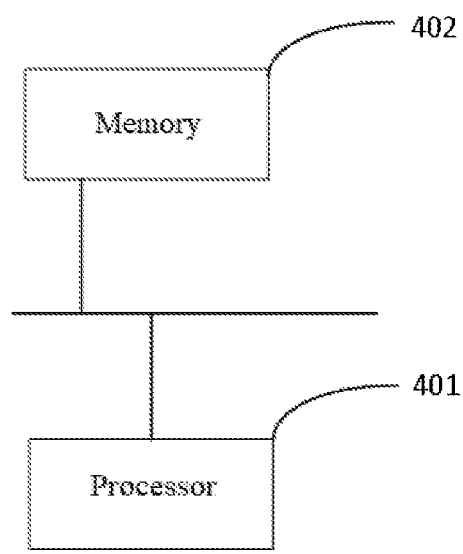
FIG. 4 is a schematic structure diagram of a mark detection apparatus according to an embodiment of the present disclosure.

Still another embodiment of the present disclosure relates to a mark detection apparatus, as shown in FIG. 4, comprising:

at least one processor 401; and, a memory 402 in communicative connection to the at least one processor 401, wherein the memory 402 stores instructions that can be performed by at least one processor 401, the instructions are performed by the at least one processor 401, so that the at least one processor 401 may perform the mark detection method described above.

Wherein, the memory 402 and the processor 401 are connected by a bus. The bus may comprise any number of interconnected buses and bridges, and the bus connects various circuits of the one or more processors 401 and the memory 402. The bus may also connect various other circuits such as peripheral devices, voltage regulators and power management circuits, which are well-known in the art. Therefore, the present disclosure will not be further described herein. A bus interface provides an interface between the bus and a transceiver. The transceiver may be one element or a plurality of elements, for example, a plurality of receives and transmitters, providing a unit for communicating with various other apparatuses on a transmission medium. The data processed by the processor 401 is transmitted on a wireless medium by an antenna. Further, the antenna also receives the data and transmits the data to the processor 401.

The processor 401 is responsible for managing the bus and general processing, and may also provide various functions, including timing, peripheral interface, voltage regulation, power management and other control functions. The memory 402 may be configured to store the data used by the processor 401 when performing operations.

Yet another embodiment of the present disclosure relates to a computer-readable storage medium storing computer programs. When the computer program is performed by a processor, the above method embodiments are realized.

That is, it should be understood by those skilled in the art that all or some of the steps in the methods in the foregoing embodiments may be implemented by instructing related hardware by programs. The programs are stored in a storage medium and comprise a number of instructions for causing a device (which may be a single-chip computer, a chip, etc.) or a processor to perform all or some of the steps in the methods in various embodiments of the present disclosure. The above-mentioned storage medium comprises various mediums capable of storing program codes, such as: U disks, mobile hard disks, read-only memories (ROMs), random access memories (RAMs), magnetic disks or optical disks etc.

It may be understood by a person of ordinary skill in the art that the above embodiments are specific embodiments for realizing the present disclosure, and in actual applications, various changes may be made to the form and details without departing from the spirit and scope of the present disclosure. Those skilled in the art can make their own changes and modifications without departing from the spirit and scope of the present disclosure. Therefore, the protection scope of the present disclosure shall be subject to the scope defined by the claims.

What is claimed is:

1. A mark detection method, comprising:
    acquiring on-off information of marks on a photomask to be manufactured;
    comparing the on-off information with preset on-off information to determine whether the on-off information is consistent with the preset on-off information; and
    correcting the on-off information according to the preset on-off information when it is determined that the on-off information is inconsistent with the preset on-off information;
    wherein the acquiring on-off information of marks on a photomask to be manufactured comprises:
    acquiring on-off information of N marks on a photomask to be manufactured, the N marks containing M mark types, both N and M being integers greater than 1;
    wherein before the comparing the on-off information with preset on-off information, the method further comprises:
    establishing M blocks according to the M mark types, one of the blocks containing a plurality of marks belonging to a same mark type; and
    merging the M blocks, and setting M identification layers according to the M blocks, one block corresponding to one identification layer;
    wherein the comparing the on-off information with preset on-off information comprises:
    comparing the on-off information of the marks in the merged blocks with preset on-off information according to the identification layers.

2. The mark detection method according to claim 1, wherein the M mark types comprise at least one of:
    overlay mark, alignment mark, and detection mark.

3. The mark detection method according to claim 1, wherein the establishing M blocks according to the M mark types comprises:

determining, according to the mark types, distribution regions of the marks on the photomask to be manufactured; and
generating the blocks according to the distribution regions.

4. The mark detection method according to claim 3, wherein the distribution regions comprise a plurality of mark strip-shaped regions.

5. The mark detection method according to claim 4, wherein a number of marks and mark type of marks contained in different mark strip-shaped regions in a same block are same.

6. The mark detection method according to claim 1, wherein the preset on-off information is acquired by:
acquiring sub preset on-off information of each mark; and
integrating the sub preset on-off information to generate the preset on-off information.

7. The mark detection method according to claim 6, wherein the sub preset on-off information is integrated by scripts, and the on-off information of the marks in the merged blocks is compared with the preset on-off information by scripts.

8. The mark detection method according to claim 1, wherein the comparing the on-off information with preset on-off information comprises:
inputting the on-off information and the preset on-off information into a preset detection program; and
comparing the on-off information with the preset on-off information according to the detection program.

9. The mark detection method according to claim 1, after the correcting the on-off information according to the preset on-off information, further comprising:
determining whether the on-off information is consistent with the preset on-off information again; and
when it is determined that the on-off information is inconsistent with the preset on-off information, correcting the on-off information according to the preset on-off information until the on-off information is consistent with the preset on-off information.

10. A mark detection apparatus, comprising: at least one processor; and, a memory in communicative connection to the at least one processor, wherein the memory stores instructions performable by the at least one processor, the instructions are performed by the at least one processor, the at least one processor to perform the mark detection method according to claim 1.

11. A non-transitory computer-readable storage medium storing computer programs, when the computer programs are executed by a processor, the mark detection method according to claim 1 is realized.

12. The non-transitory computer-readable storage medium according to claim 11, wherein the M mark types comprise at least one of:
overlay mark, alignment mark, and detection mark.

13. The non-transitory computer-readable storage medium according to claim 11, wherein the establishing M blocks according to the M mark types comprises:
determining, according to the mark types, distribution regions of the marks on the photomask to be manufactured; and
generating the blocks according to the distribution regions.

14. The non-transitory computer-readable storage medium according to claim 13, wherein the distribution regions comprise a plurality of mark strip-shaped regions.

15. The non-transitory computer-readable storage medium according to claim 14, wherein a number of marks and mark type of marks contained in different mark strip-shaped regions in a same block are same.

16. The non-transitory computer-readable storage medium according to claim 11, wherein the preset on-off information is acquired by:
acquiring sub preset on-off information of each mark; and
integrating the sub preset on-off information to generate the preset on-off information.

17. The non-transitory computer-readable storage medium according to claim 16, wherein the sub preset on-off information is integrated by scripts, and the on-off information of the marks in the merged blocks is compared with the preset on-off information by scripts.

18. The non-transitory computer-readable storage medium according to claim 11, wherein the comparing the on-off information with preset on-off information comprises:
inputting the on-off information and the preset on-off information into a preset detection program; and
comparing the on-off information with the preset on-off information according to the detection program.

19. The non-transitory computer-readable storage medium according to claim 11, wherein after the correcting the on-off information according to the preset on-off information, the method further comprises:
determining whether the on-off information is consistent with the preset on-off information again; and
when it is determined that the on-off information is inconsistent with the preset on-off information, correcting the on-off information according to the preset on-off information until the on-off information is consistent with the preset on-off information.

\* \* \* \* \*